(12) United States Patent
Lin et al.

(10) Patent No.: US 8,054,046 B2
(45) Date of Patent: Nov. 8, 2011

(54) FAST SEARCH ALGORITHM FOR FINDING INITIAL DIFFUSION VOLTAGE IN ELECTRO-CHEMICAL SYSTEMS

(75) Inventors: Jian Lin, Beverly Hills, MI (US); Brian J. Koch, Berkley, MI (US); Damon R. Frisch, Troy, MI (US); Michael J. Gielniak, Romeo, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 870 days.

(21) Appl. No.: 12/018,653

(22) Filed: Jan. 23, 2008

(65) Prior Publication Data

US 2008/0135315 A1    Jun. 12, 2008

Related U.S. Application Data

(63) Continuation-in-part of application No. 11/567,239, filed on Dec. 6, 2006, now Pat. No. 7,646,166.

(51) Int. Cl.
*H02J 7/04* (2006.01)
(52) U.S. Cl. ......... 320/156; 320/104; 320/136; 903/903
(58) Field of Classification Search .......... 320/104, 320/134, 136, 148, 156, 157, 161, 162; 324/427
See application file for complete search history.

(56) References Cited

U.S. PATENT DOCUMENTS

| 6,016,047 | A | * | 1/2000 | Notten et al. | 320/137 |
| 6,639,385 | B2 | | 10/2003 | Verbrugge et al. | |
| 2004/0162683 | A1 | | 8/2004 | Verbrugge et al. | |
| 2005/0248315 | A1 | * | 11/2005 | Hartley et al. | 320/132 |

* cited by examiner

*Primary Examiner* — Edward Tso
*Assistant Examiner* — Aaron Piggush
(74) *Attorney, Agent, or Firm* — Ingrassia Fisher & Lorenz, P.C.

(57) ABSTRACT

A method for rapidly determining an initial diffusion voltage $(V_{diff})_{initial}$ as a starting point in calculating a diffusion voltage in an electro-chemical cell (e.g., a battery used in an automotive vehicle) includes obtaining a time difference $t_{off}$ between a time when the cell was last turned-OFF and a time when the cell was next turned-ON, selecting a starting diffusion voltage $(V_{diff})_{start}$ based on $t_{off}$, determining a trial diffusion voltage $V_{diff}$ based on a diffusion circuit model and $(V_{diff})_{start}$, calculating an error voltage $V_{error} = (V_{diff}) - |V_{OFF} - V_{ON}|$ where $V_{OFF}$ and $V_{ON}$ are cell voltages at turn-OFF and turn-ON respectively, repeating the foregoing determining and calculating steps using for each iteration $(V_{diff})_{start} = (V_{diff})_{previous} + V_{error}$ until $V_{error}$ is less than or equal to a first predetermined tolerance amount $\epsilon$, storing in a memory a value of $V_{diff}$ corresponding to the condition $V_{error} \leq \epsilon$, and setting $(V_{diff})_{initial}$ equal to the just stored value of $V_{diff}$. A further diffusion voltage $V_{diff}$ is then determined using the same diffusion circuit model and the just obtained $(V_{diff})_{initial}$ and is advantageously used by a controller in an electric propulsion vehicle to determine a state of charge of the propulsion battery.

20 Claims, 4 Drawing Sheets

FAST SEARCH ALGORITHM FOR FINDING INITIAL DIFFUSION VOLTAGE IN ELECTRO-CHEMICAL SYSTEMS

CROSS-REFERENCES TO RELATED APPLICATIONS

This application is a continuation-in-part of application Ser. No. 11/567,239, filed Dec. 6, 2006.

TECHNICAL FIELD

The present invention relates to the field of electrochemical systems and, more specifically, to a method and apparatus for rapidly modeling diffusion in an electrochemical system, for example, a battery system used in conjunction with a motor vehicle

BACKGROUND OF THE INVENTION

Batteries are used in a wide range of motor vehicle applications. For example, the desire to improve fuel economy and reduce the amount of pollutants emitted by vehicles has led to the development of hybrid electric vehicles (HEVs) incorporating sophisticated battery systems.

There are several different types of HEVs. Parallel HEVs use both an internal combustion engine (ICE) and an electric motor to propel the vehicle, while serial HEVs use an electric motor to propel the vehicle and the ICE to generate electrical energy and run the electric motor. In a third type of HEV, known as a "start/stop" HEV, the ICE propels the vehicle and the electrical system is used to operate the vehicle when the vehicle is stationary. The ICE then restarts when the vehicle starts to move.

Common to all types of HEVs is a battery that undergoes various charge and discharge cycles as the battery powers the vehicle and/or vehicular components. It is important to know the state of the battery as expressed by the state of charge (SOC) of the battery. In order to make decisions regarding the battery, such as when to actively charge the battery, it is important to know the SOC of the battery.

Different methods have been developed to determine the SOC. One method to determine the SOC is based upon the use of an equivalent circuit of a battery system to model the battery. The equivalent circuit that models the battery accounts for factors such as the surface charge on the plates of the battery. Such a method and system is disclosed in U.S. Pat. No. 6,639,385, entitled "State of Charge Method and Apparatus," issued on Oct. 28, 2003, and U.S. Publication No. U.S. 2004/0162683, entitled "Method and Apparatus for Generalized Recursive Least-Squares Process for Battery State of Charge and State of Health," filed Feb. 8, 2003. While prior equivalent circuits provide an effective model for determining the SOC of the battery, more accurate models are desirable. Further, while methods and apparatus such as has been described in the related application noted above have improved modeling of the diffusion inherent in battery systems, the time required to execute such models, especially estimating the initial diffusion voltage needed for such calculations, has been longer than desired. In automotive applications, it is important that the initial diffusion voltage be obtainable quickly so that the SOC may be rapidly determined.

Accordingly, it is desired to provide method and apparatus for more rapidly determining an initial diffusion voltage for use in modeling an electrochemical system, especially a battery system for us in electric vehicles. Furthermore, the desirable features and characteristics of the present invention will be apparent from the subsequent detailed description and the appended claims, taken in conjunction with the accompanying drawings and the foregoing technical field and background.

SUMMARY OF THE INVENTION

In accordance with one embodiment of the present invention, a method for determining an initial diffusion voltage $(V_{diff})_{initial}$ as a starting point in calculating a diffusion voltage in an electro-chemical cell (e.g., a battery used in an automotive vehicle) comprises, obtaining a time difference $t_{off}$ between a time when the cell was last turned-OFF and a time when the cell was next turned-ON, selecting a starting diffusion voltage $(V_{diff})_{start}$ based on $t_{off}$, determining a trial diffusion voltage $V_{diff}$ based on a diffusion circuit model and $(V_{diff})_{start}$, calculating an error voltage $V_{error}=(V_{diff})-|V_{OFF}-V_{ON}|$ where $V_{OFF}$ and $V_{ON}$ are cell voltages at turn-OFF and turn-ON respectively, repeating the foregoing determining and calculating steps using for each iteration $(V_{diff})_{start}=(V_{diff})_{previous}+V_{error}$ until $V_{error}$ is less than or equal to a first predetermined tolerance amount $\epsilon$, storing in a memory a value of $V_{diff}$ corresponding to the condition $V_{error} \leq \epsilon$, and setting $(V_{diff})_{initial}$ equal to the just stored value of $V_{diff}$.

In accordance with a further embodiment, a further diffusion voltage $V_{diff}$ is then determined using the same diffusion circuit model and the just obtained $(V_{diff})_{initial}$ and is advantageously used by a controller in an electric propulsion vehicle to determine a state of charge of the propulsion battery.

In accordance with a still further embodiment, the selecting step comprises, if $t_{off} \leq t1$, where t1 is a first predetermined constant, setting $\Delta t$ used in determining $V_{diff}$ equal to $(t_{off})/b$ where b is second predetermined amount and setting $(V_{diff})_{start}=|V_{OFF}-V_{ON}|$. In a yet further embodiment, the selecting step further comprises, if $t_{off}$ is not $\leq t1$, determining whether $t_{off} \geq t2$ where t2 is a second predetermined constant greater than t1, and if $t_{off}$ is not $\geq t2$, setting $\Delta t=\Delta t_a$ where $\Delta t_a$ is third predetermined amount smaller than t1 and setting $(V_{diff})_{start}=|V_{OFF}-V_{ON}|$, and if $t_{off} \geq t2$, setting $(V_{diff})_{start}=0$.

In accordance with another embodiment of the present invention, an energy management controller for a vehicle comprises a memory and a processor coupled to the memory. The processor is configured to determine an initial diffusion voltage and a further diffusion voltage according to the method described above. The processor is further configured to determine a battery condition parameter using the further diffusion voltage. The memory is configured to store various battery condition parameters and intermediate values.

In accordance with yet another embodiment, a hybrid electric vehicle comprises an internal combustion engine, an electric motor generator configured for use as a generator to produce a charging voltage, and a battery coupled to the electric motor generator. An engine control computer is coupled to the internal combustion engine, the electric motor generator, and the battery. The engine control computer comprises a memory and a processor coupled to the memory and configured to estimate an initial diffusion voltage and determine a further diffusion voltage based on a diffusion circuit model and the initial diffusion voltage determined according to the method described above. The processor is further configured to determine a state of charge of the battery using the further diffusion voltage.

DESCRIPTION OF THE DRAWINGS

The present invention will hereinafter be described in conjunction with the following drawing figures, wherein like numerals denote like elements, and.

DESCRIPTION OF AN EXEMPLARY EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
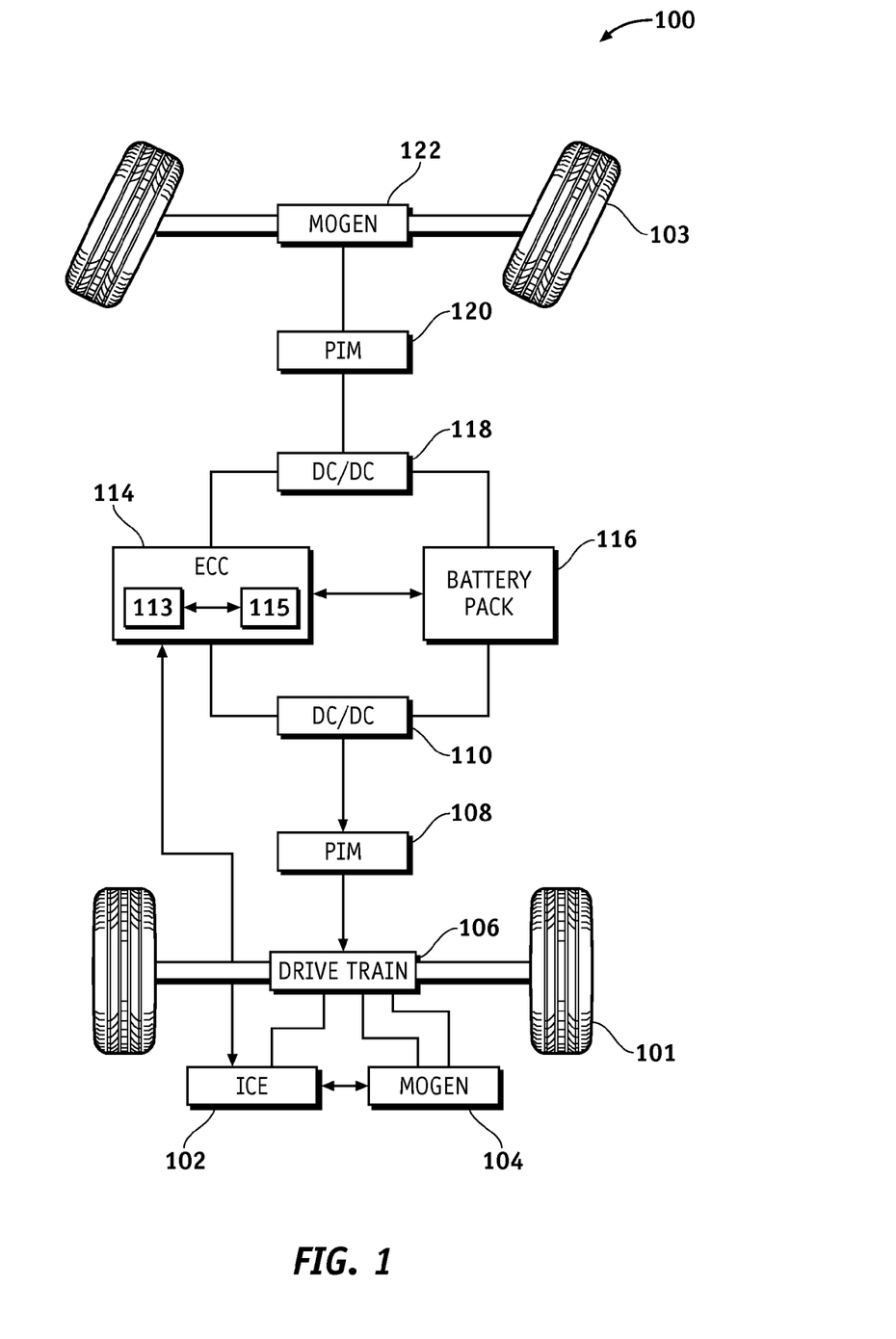
FIG. 1 illustrates a block diagram of an exemplary embodiment of a hybrid electric vehicle in accordance with the teachings of the present invention.

FIG. 1 is a block diagram of an exemplary embodiment of a hybrid electric vehicle (HEV) 100 useful in describing the present invention. As a preliminary matter, it should be noted that the invention may be implemented in the context of a variety of vehicle battery systems, and is not limited to HEV applications. Furthermore, in the exemplary embodiment of FIG. 1, HEV 100 is illustrated as a parallel HEV, although other types of HEVs are within the scope of the present invention.

HEV 100 comprises a first electric motor generator (MOGEN) 104 coupled to an internal combustion engine (ICE) 102, both of which are coupled to a drive train 106, which is coupled to the rear wheels 101. The first MOGEN 104 is coupled to the battery pack 116 via a first DC-to-DC converter 110 and a first power inverter module 108. An engine control computer (ECC) 114 is coupled to the ICE 102 and the first MOGEN 104 via first DC-to-DC converter 110 and first power inverter module 108. In one exemplary embodiment, an optional second MOGEN 122 is coupled to the front wheels 103. The second MOGEN 122 is coupled to a second power inverter module 120 and a second DC-to-DC converter 118.

First MOGEN 104 can function as a motor to propel HEV 100 or as a generator to charge battery pack 116. In FIG. 1, first MOGEN 104 operates the rear wheels 101 via drive train 106. Second MOGEN 122, in an exemplary embodiment, can be used to drive front wheels 103 via second power inverter module 120 and second DC-to-DC converter 118. While FIG. 1 illustrates first MOGEN 104 and second MOGEN 122 as single units, a separate motor and a separate generator can be provided for each.

ICE 102 can be used to propel the HEV 100. Additionally, ICE 102 can operate the first MOGEN 104 to generate an AC voltage. The AC voltage can be converted to a DC voltage by the first power inverter module 108 to charge the battery pack 116. ICE 102 can be any of the well-known ICEs 102 designed for use in a vehicle.

First DC-to-DC converter 110 can convert the AC voltage generated by first MOGEN 104 and inverted by first power inverter module 108 into a higher DC voltage needed to charge battery pack 116. The first DC-to-DC converter 110 can also step down voltage from the battery pack 116 when the battery pack 116 is used to run the first MOGEN 104.

ECC 114 operates as an energy management controller to monitor battery parameters and as a hybrid system controller to control the operation of vehicular components such as the first MOGEN 104, the second MOGEN 122, and the ICE 102. ECC 114, in one embodiment, monitors parameters such as the battery current, the battery voltage, the battery state of charge (SOC), internal resistance, power output and the like. ECC 114, in one exemplary embodiment, includes a processor 113 for determining, among other battery and system parameters, the diffusion voltage and the SOC. A memory 115 is coupled to the processor 113 and can store data such as a plurality of battery condition parameters. In the present invention, the diffusion voltage determined at the ECC 114 can be used in calculating the SOC or other battery condition parameters. ECC 114 can be a single controller or can be a combination of two or more separate controllers distributed throughout the HEV 100.

Battery pack 116 comprises a plurality of batteries connected, in a typical embodiment, in series. Battery pack 116 can be used to power the first MOGEN 104 to operate the drive train 106 or power the HEV 100. The battery pack 116 can be actively charged by the first MOGEN 104 and/or passively charged via a regenerative braking system (not pictured). In one exemplary embodiment, battery pack 116 comprises a plurality of nickel-metal hydride (NiMH) batteries, although other battery chemistry, such as lead-acid, lithium ion, lithium poly-ion and the like may be used.

Figure 2:
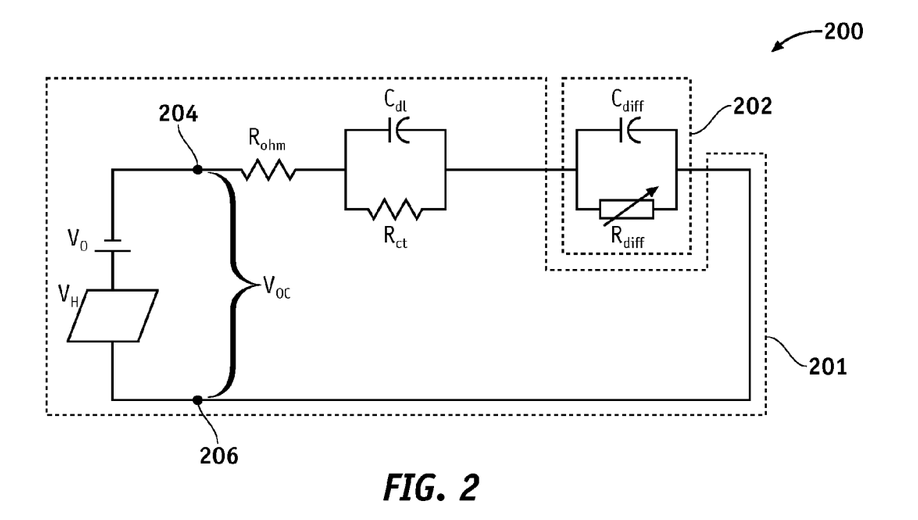
FIG. 2 is a circuit diagram of an exemplary embodiment of an equivalent circuit with a diffusion circuit element in accordance with the teachings of the present invention.

FIG. 2 illustrates an exemplary embodiment of a battery equivalent circuit 200 including a conventional equivalent circuit 201 and a diffusion circuit element 202. The conventional equivalent circuit 201 includes a hysteresis voltage source, $V_H$, in serial with a battery voltage source, $V_o$, and a series resistance, $R_{ohm}$. Between point 204 and 206, an open circuit voltage, $V_{oc}$, is defined. The open circuit voltage is equal to the sum of the hysteresis voltage source, $V_H$, and the battery voltage source, $V_o$. A capacitor, $C_{dl}$, is coupled in parallel with a resistance, $R_{ct}$.

The elements of conventional equivalent circuit 201 are part of a known conventional equivalent circuit that can be used to model the battery behavior and accounts for factors such as the surface charge on the plates of the battery. The conventional equivalent circuit 201 and its behavior is disclosed in U.S. Pat. No. 6,639,385, entitled "State of Charge Method and Apparatus," issued on Oct. 28, 2003, and U.S. Publication No. U.S. 2004/0162683, entitled "Method and Apparatus for Generalized Recursive Least-Squares Process for Battery State of Charge and State of Health," filed Feb. 8, 2003, which are hereby incorporated for all purposes.

The battery equivalent circuit 200 of the present invention includes a diffusion circuit element 202 to model the diffusion voltage in the battery. Diffusion circuit element 202 comprises a diffusion capacitor, $C_{diff}$, coupled in parallel to a variable resistance, $R_{diff}$. The variable resistance, $R_{diff}$, is a function of the charge on the diffusion capacitor, $U_{cap}$, which can be expressed as:

$$R_{diff} = f(U_{cap}) \qquad \text{Eqn. 1}$$

The diffusion circuit element 202 has a time constant, $\tau$, equivalent to the product of the diffusion capacitor and the variable resistance:

$$\tau = R_{diff} \times C_{diff} \qquad \text{Eqn. 2}$$

Since the variable resistance, $R_{diff}$, is a function of the charge on the diffusion capacitor, $U_{cap}$, the time constant, $\tau$, will also vary as a function of the charge on the diffusion capacitor, $U_{cap}$. Therefore, the behavior of the diffusion circuit element 202 can be related to the time constant, $\tau$.

The diffusion circuit element 202 models the diffusion process in an electrochemical cell. Diffusion is the movement of ions in response to a concentration gradient. Transport of the diffusing ions occurs from areas of high concentration to areas of low concentration at a rate that is directly proportional to the diffusivity of the ions and the magnitude of the gradient. In an electrochemical process, a gradient is created by the conversion of a reactant to a product at an electrode. For example, in a lead acid battery, the reaction at the anode on discharge of the battery is:

$$Pb + SO_4^{2-} \Leftrightarrow PbSO_4 + 2e^- \qquad \text{Eqn. 3}$$

In other words, in this example, the reactants, Pb (lead) and $SO_4^{2-}$ (sulfate anion), are converted to the product, $PbSO_4$ (lead sulfate). As the $SO_4^{2-}$ reactant nearest the electrode is consumed to form solid $PbSO_4$, more $SO_4^{2-}$ from the bulk of the electrolyte in the battery moves in to replenish the consumed $SO_4^{2-}$. If the rate at which $SO_4^{2-}$ is consumed at the electrode exceeds the rate at which the $SO_4^{2-}$ can diffuse from the electrolyte to the electrode, the local concentration of $SO_4^{2-}$ at the surface of the electrode will decrease as the reaction proceeds. The difference between the local concentration of $SO_4^{2-}$ and the concentration of $SO_4^{2-}$ in the rest of the electrolyte forms a gradient that provides the driving force for diffusion. The extent to which the gradient develops depends upon the rate of reaction at the electrode and the diffusivity of the diffusing species. Gradients can develop in liquid, solid or gas phases in the system, depending upon the nature of the electrochemical reaction and the design of the electrochemical cell.

In electrochemical cells, the concentration gradients in the diffusing species that are responsible for energy storage and release are manifested as voltage transients that can be acquired at the electrical terminals of the electrochemical cell. The magnitude and rates of change of the voltage transients are proportional to the diffusivity of the reacting species and the magnitude of the gradients. The larger the magnitude of the gradients, the larger and faster changing the voltage transients and the smaller the magnitude of the gradients, the smaller and slower changing the voltage transients.

Figure 3:
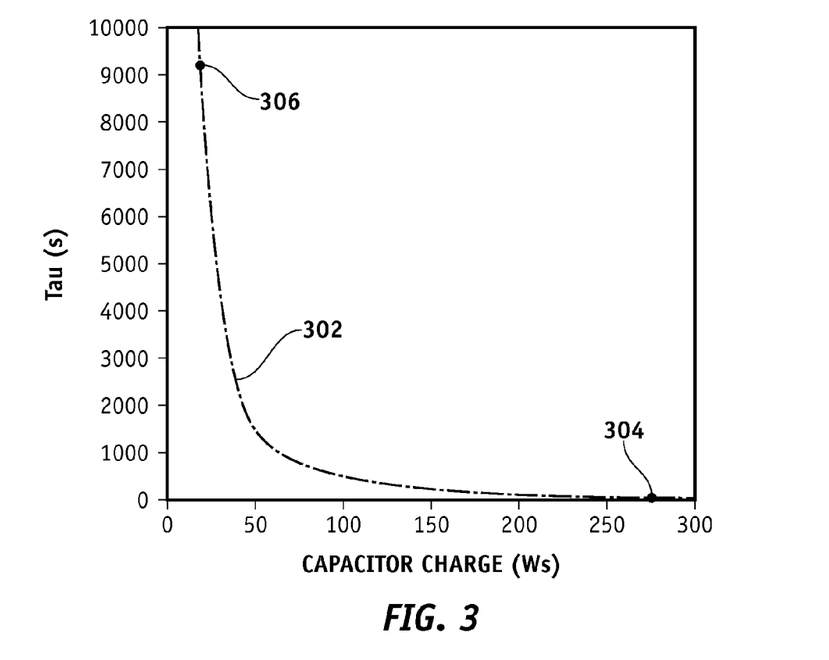
FIG. 3 is a graph illustrating the relationship between the charge on the capacitor and the time constant in accordance with the teachings of the present invention.

The diffusion circuit element 202 models this behavior as shown in FIG. 3, which is a graph 302 depicting the exponential relationship between the charge on the diffusion capacitor, $U_{cap}$, and the time constant, $\tau$. For example, at point 304 on the graph 302 there is a large charge on the diffusion capacitor at a low time constant, $\tau$, value. The large charge on the diffusion capacitor at the low time constant value represents a large, fast-changing voltage occurring within the diffusion circuit element 202. This is representative of a large gradient.

Point 306 on the graph 302 represents a low charge on the diffusion capacitor when the time constant is large. This represents a small gradient. The relationship between the time constant, $\tau$, and the charge on the diffusion capacitor, $U_{cap}$, between the two extreme values is allowed to vary exponentially.

A diffusion voltage, $V_{diff}$, in the diffusion circuit element 202 can be represented by the following diffusion voltage equation:

$$V_{diff} = IA_{diff}\Delta t + \exp\left(-\frac{\Delta t}{\tau_{t-\Delta t}}\right) \times V_{diff, t-\Delta t} \qquad \text{Eqn. 4}$$

where I is the current flowing through the diffusion circuit element 202 at the time $\Delta t$, $A_{diff}$ is the reciprocal of the diffusion capacitor ($1/C_{diff}$), $\tau_{t-\Delta t}$ is the value of time constant from a previous time step, and $V_{diff, t-\Delta t}$ is the value of the diffusion voltage from a previous time step. Under open circuit conditions I=0 and Eqn. 4 becomes:

$$V_{diff} = \exp\left(-\frac{\Delta t}{\tau_{t-\Delta t}}\right) \times V_{diff, t-\Delta t} \qquad \text{Eqn. 4A}$$

The calculation of the time constraint, $\tau$, begins with the calculation of the charge on the capacitor:

$$U_{cap} = \frac{1}{2A_{diff}} V_{diff}^2. \qquad \text{Eqn. 5}$$

The value of the charge on the capacitor is then used in the calculation of the time constant, $\tau$:

$$\tau = \tau_{intercept} \times U_{cap}^{\tau_{exponent}} \qquad \text{Eqn. 6}$$

The calculated value of the time constant, $\tau$, from Eqn. 6 is typically bounded between some minimum and maximum value before it is used in Eqn. 4.

The values for $A_{diff}$, $\tau_{intercept}$ and $\tau_{exponent}$, in one exemplary embodiment, can be taken from look-up tables constructed from experimental data obtained for the electrochemical system of interest. The values may be functions of the temperature, state of charge, and age of the electrochemical system. These values can be stored in the memory 115 of the ECC 114. In one exemplary embodiment, the diffusion voltage equation (Eqn. 4) can be used with battery state algorithms that can extract needed parameters. In this embodiment, the algorithm can adapt the values of $A_{diff}$ and $\tau_{exponent}$ in response to changes in temperature, SOC and age of the electrochemical system, rather than using look-up tables.

In order to calculate the diffusion voltage, $V_{diff}$, an initial value $(V_{diff})_{init}$ for the diffusion voltage is required at the first time step of operation to start the calculation of the diffusion voltage. In one exemplary embodiment, a value of the diffusion voltage $V_{diff}$ can be estimated by first observing the change in the voltage of the electrochemical system during periods of rest at an open circuit. For example, in a vehicle application, the last measured open circuit voltage at the time the vehicle is powered down after allowing about 10 to 30 seconds double-layer capacitance settling time to let the voltage on double layer capacitance completely discharge (hereafter the "key-off" or "turn-off" voltage), so that the observed voltage is purely caused by the diffusion voltage, and the first measured open circuit voltage when the vehicle is powered on (hereafter the "key-on" or "turn-on" voltage) can be used to estimate the diffusion voltage $V_{diff}$. An elapsed time between the key-off state and the key-on state, $t_{off}$, can also be used to find the initial diffusion voltage $(V_{diff})_{init}$.

Figure 4:
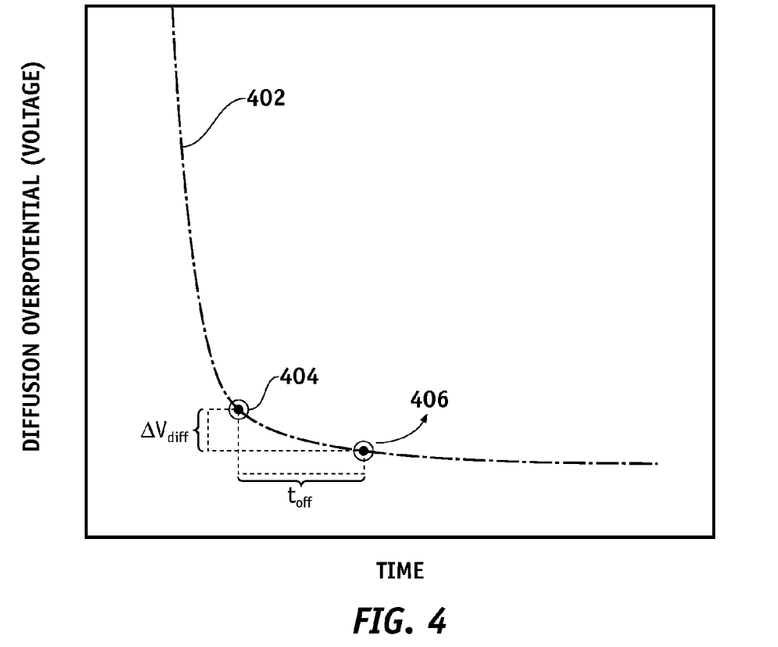
FIG. 4 is a graph illustrating the relationship between diffusion voltage and elapsed time in accordance with the teachings of the present invention.

After the elapsed time between the "key-off" (or "turn-off") state and the "key-on" (or "turn-on") state is determined, the initial value of the diffusion voltage $(V_{diff})_{init}$ can be estimated. FIG. 4 illustrates a curve 402 of diffusion voltage, $V_{diff}$, vs. time t. Curve 402 illustrates the decay of the diffusion voltage $V_{diff}$ from a very high value to a very small value over time at open circuit. The difference between any two measured open circuit voltages ($\Delta V$) over the elapsed time ($t_{off}$), such as the difference between the open circuit voltage between key-off and key-on, can be mapped on to the curve 402. A given combination of $\Delta V$ and $t_{off}$ will coincide with the curve 402 in one unique position, with the initial value of $V_{diff}$ at power-up corresponding to the intersection of the data with the curve at the end of the time interval $t_{off}$. For example, in one exemplary embodiment, point 404 of curve 402, represents the diffusion voltage measured the last time the vehicle was turned off (key-off) and point 406, of curve 402, represents the diffusion voltage measured when the vehicle is started after the last time the vehicle was turned off (key-on). The voltage at point 406 would represent the initial diffusion voltage.

One way to determine an initial diffusion voltage $(V_{diff})$init is to select a high value of the diffusion voltage, $V_{diff}$, on the curve 402 and to calculate an expected ending diffusion voltage value after the time, $t_{off}$, has elapsed. The difference in these two values of diffusion voltage is compared to the difference in two measured values of voltage taken at the last key-off time and last key-on time as discussed previously. If the two differences match within some predetermined tolerance level $\epsilon$, then the calculated value of diffusion voltage after an elapsed time period can be used as the initial value of the diffusion voltage for Eqn. 4.

If the two differences do not match within the predetermined tolerance level $\epsilon$, then the calculation is repeated with the starting value of diffusion voltage selected lower on the curve 402. The process is repeated by decrementing the starting value of the diffusion voltages, $V_{diff}$, on the curve by a certain predetermined amount until a match between the calculated difference between the diffusion voltage, $V_{diff}$, values and the measured difference between the voltages at key-off time and key-on time is found. If the calculated ending value of the diffusion voltage reaches a small value after many iterations and no match has been found, then the initial diffusion voltage $(V_{diff})_{init}$ takes on a default value of "0" volts. In order to reduce the amount of time required to find the initial diffusion voltage, more sophisticated search routines may be employed to find a match between the measured data and curve 402 and are within the teachings of the present invention.

Figure 5:
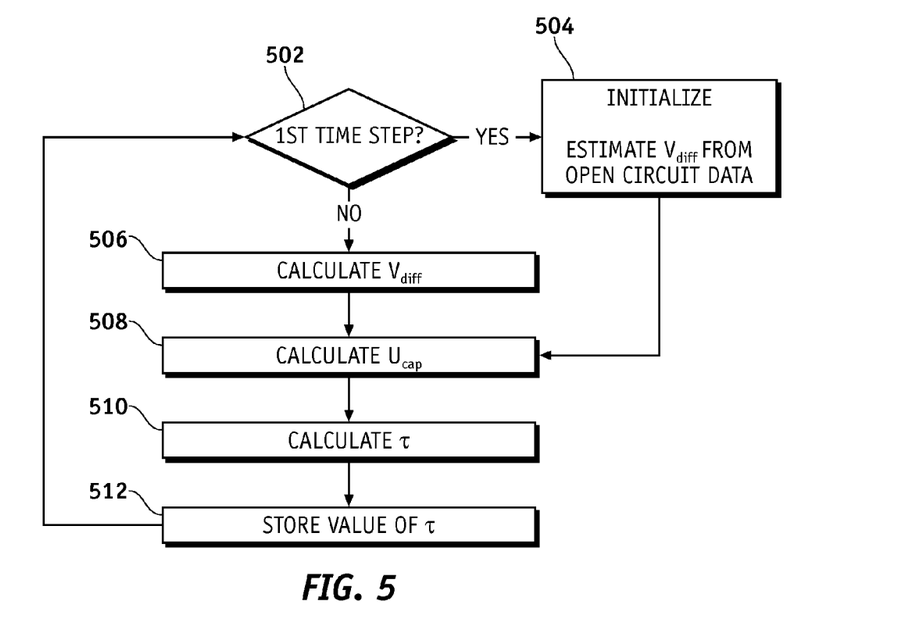
FIG. 5 is a flowchart of an exemplary method for determining diffusion voltage ($V_{diff}$) in accordance with the teachings of the present invention.

FIG. 5 is a flowchart illustrating an exemplary method for calculating the diffusion voltage, $V_{diff}$, in battery pack 116. In a first step, step 502, it is first determined if it is the first time the diffusion voltage has been calculated since the vehicle has been started.

If it is the first time the diffusion voltage has been calculated since the vehicle has been started, in step 504, an initial diffusion voltage is estimated. In one exemplary embodiment, the initial diffusion voltage $(V_{diff})_{init}$ can be estimated using the method discussed above in conjunction with FIG. 4. After the initial diffusion voltage is estimated, the method proceeds to step 508, which is discussed in detail below.

If it is not the first time the diffusion voltage has been calculated since the vehicle has been started, at step 506, the diffusion voltage is calculated using Eqn. 4. Eqn. 4 utilizes a previous value of the diffusion voltage to calculate a current diffusion voltage. The necessity of a previous value of the diffusion voltage to calculate a current value is why an initial diffusion voltage $(V_{diff})_{init}$ is estimated in step 504.

In step 508, which is reached either after step 504 when an initial diffusion voltage is calculated or after step 506 when a current diffusion voltage is calculated using a previous diffusion voltage, the charge on the capacitor, $U_{cap}$, is calculated using Eqn. 5. The charge on the capacitor, $U_{cap}$, determined in step 508, is then used in step 510 to calculate the time constant, $\tau$, using Eqn. 6. The calculated time constant, $\tau$, is stored for further use in step 512.

In one exemplary embodiment, the time constant, $\tau$, is stored in memory 115, along with other parameters related to battery condition. Additionally, in one embodiment, the calculations performed in steps 504-510 are done using the processor 113 of the ECC 114

The conventional equivalent circuit 201 along with the diffusion circuit element 202, can then be used to determine an equation for the overall voltage in the battery:

$$V = V_0 + IR + \frac{I\Delta t}{C_D} + \exp\left(-\frac{\Delta t}{R_{ct}C_D}\right)(V - V_{OC} - IR - V_{diff})_{t-\Delta t} + V_{diff} + V_H \quad \text{Eqn. 7}$$

This equation can be used as a recursive equation to determine the battery voltage.

The state of charge in the battery can be determined by using the relationship:

$$SOC = w(SOC_c) + (1-w)SOC_v \quad \text{Eqn. 8}$$

where w is a weighting factor, $SOC_c$ is a state of charge calculated by Coulomb integration and $SOC_v$ is the state of charge based on voltage. The $SOC_c$ can be determined using an integration method and an equation for the $SOC_v$ can be derived from the overall voltage in the battery. The derivation of such equations is disclosed in U.S. Pat. No. 6,639,385, entitled "State of Charge Method and Apparatus," issued on Oct. 28, 2003, and U.S. Publication No. U.S. 2004/0162683, entitled "Method and Apparatus for Generalized Recursive Least-Squares Process for Battery State of Charge and State of Health," filed Feb. 8, 2003. In these references, the calculations are done without considering the calculation of the diffusion voltage. In the present invention, the model includes the voltage contributed by diffusion and the equations can be adapted to account for the diffusion voltage.

Figure 6:
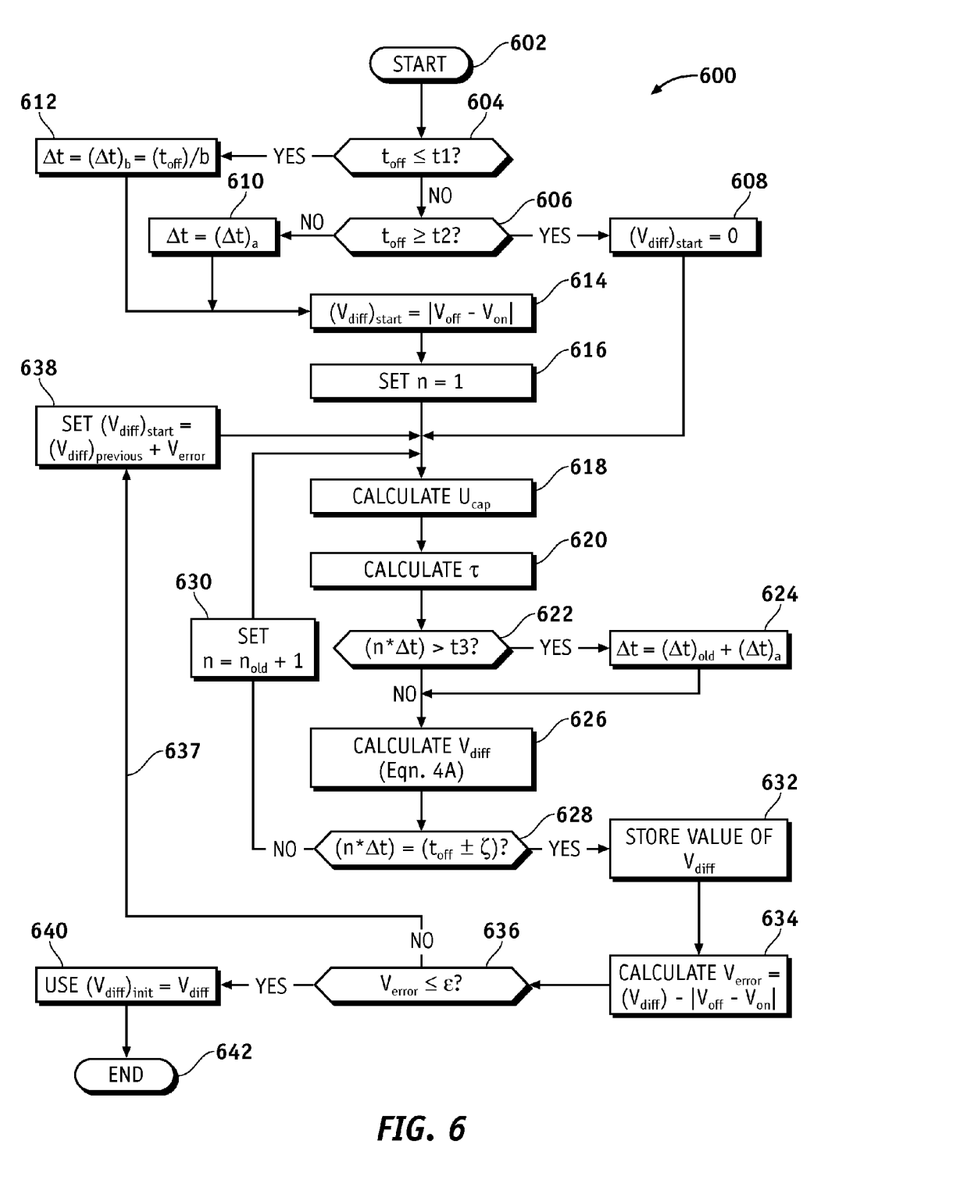
FIG. 6 is a flowchart of an exemplary method for rapidly determining an initial diffusion voltage ($V_{diff}$)$_{init}$ in accordance with further embodiments of the present invention.

It has been found that the time required to obtain an initial diffusion voltage value $(V_{diff})_{init}$ and therefore the time needed to evaluate the battery state can be substantially reduced by use of method 600 illustrated in FIG. 6. The method of FIG. 6 is based upon judicious selection of starting diffusion voltage values $(V_{diff})_{start}$ and variable time interval values $\Delta t$ used in conjunction with the equations presented herein, to rapidly and accurately locate the current diffusion potential state on a standard diffusion potential versus time plot such as that shown in FIG. 4. While the method of FIG. 6 is particularly useful in connection with batteries adapted for automotive use, and for convenience and not intended to be limiting, is explained herein using such a battery system as an example, the method is more general and applies equally well to many other electrochemical systems.

Method 600 begins with START 602 and $[t_{off} \leq t1 ?]$ query 604, where $t_{off}$ is illustrated in FIG. 4 and t1 is the time in which Vdiff drops quickly as shown at the left portion of FIG. 4 up to about point 404. Initially the slope of the Vdiff versus time curve of FIG. 4 is negative and very steep and Vdiff drops very quickly. Eventually the magnitude of the slope of the Vdiff versus time curve of FIG. 4 becomes very small as the Vdiff versus time curve flattens out at larger values of time beyond point 406. According to a first embodiment, t1 is usefully the time required for the magnitude of the slope of the Vdiff versus time curve of FIG. 4 to drop to about half its initial value. This is represented on the curve of FIG. 4 where the magnitude of the slope at point 404 is about −45 degrees. Larger or smaller values in the range of about −30 to −60 degrees can also be used but about −45 degrees (i.e., about half the terminal slope value) is preferred. According to a further embodiment, for typical automotive propulsion batteries, a convenient value of t1 is about 400 to 800 seconds, preferably about 600 seconds.

If the outcome of query 604 is NO, then method 600 proceeds to [$t_{off} \geq t2$ ?] query 606, where t2 is the time by which Vdiff has dropped to small and nearly constant values, as is shown for example to the right of point 406 in FIG. 4. Stated another way, t2 is the time required for the magnitude of the slope of the Vdiff versus time curve to become very small as the curve flattens out. If point 404 illustrates the point on the $V_{diff}$ versus time curve where the slope has reached about −45 degrees (thereby defining t1 according to a first embodiment), then according to a second embodiment, t2 corresponds to the time required for the magnitude of the slope to drop to less than −5 to −15 degrees, preferable less than about −10 degrees compared to the time required for a slope at −45 degrees for t1. According to a still further embodiment, for typical automotive propulsion batteries, a convenient value of t2 is about 4 to 8 hours and preferably about 6 hours, i.e., about 21,600 seconds, but larger or smaller values can also be used. Stated another way, t2 is usefully about 20 to 60 times t1, more conveniently about 30 to 50 times t1 and preferably about 35 to 37 times t1.

If the outcome of query 606 is YES, then $(V_{diff})_{start}$ is set to zero and method 600 proceeds to step 618, explained later. If the outcome of query 606 is NO, then method 600 proceeds to step 610 wherein the time step Δt is set to a convenient value $\Delta t = \Delta t_a$. $\Delta t_a$ is usually much smaller than t1, that is, about $\frac{1}{5}^{th}$ to $\frac{1}{20}^{th}$ of t1, conveniently about $\frac{1}{10}^{th}$ of t1. According to a still further embodiment, for typical automotive propulsion batteries, a useful value of $\Delta t_a$ is about 30 to 120 seconds, more conveniently about 45 to 90 seconds and preferably about 60 seconds, but larger or smaller values can also be used. Returning to step 604, if the outcome of query 604 is YES indicating that the time difference between when the vehicle was last switched OFF and the time when the vehicles was again switched ON, referred to herein as $t_{off}$ (see FIG. 4), is less than t1, then in step 612 time step Δt is set to $\Delta t = \Delta t_b = [(t_{off})/b)]$ where b is selected so that $\Delta t_b$ is much smaller than $t_{off}$, that is, b is usefully in the range of about 5 to 25, more conveniently in the range of about 7 to 15 and preferably about 10. Following steps 610 or step 612, method 600 proceeds to step 614 wherein $(V_{diff})_{start}$ is set equal to the magnitude of $[V_{OFF} - V_{ON}]$, where $V_{OFF}$ is the open-circuit battery voltage after the capacitance double layer settling time (e.g., 10 to 20 seconds) when the battery was last switched OFF and VON is the open circuit battery voltage when the battery is again switched ON. Stated another way, $[V_{OFF} - V_{ON}]$ is the change in open circuit battery voltage over the time interval $t_{off}$.

Method 600 then proceeds to step 616 wherein an index n is set equal to 1. In subsequent step 616, the value of $U_{cap}$ is calculated as provided in Eqn. 5, using $(V_{diff})_{start}$, obtained as explained above, for $V_{diff}$ in this iteration. The calculated value of $U_{cap}$ is stored for use until a new value is obtained in a further iteration of method 600. In subsequent step 620, the value of τ is calculated according to Eqn. 6 using the just determined value of $U_{cap}$ and values of $\tau_{intercept}$ and $\tau_{exponent}$ obtained as explained in connection with Eqn. 6. Method 600 then proceeds to [n*Δt>t3 ?] query 622, where t3 is selected to be much bigger than Δt, usefully t3=5*Δt to 100*Δt, more conveniently in the range of about t3=40*Δt to 80*Δt and preferably t3=about 60*Δt. According to a still further embodiment, for typical automotive propulsion batteries, a convenient value of t3 is usefully in the range of about 300 to 6000 second, conveniently in the range of about 2400 to 4800 seconds and preferably about 3600 seconds, but larger and smaller values can also be used.

If the outcome of query 622 is YES, then method 600 proceeds to step 624 wherein the time step Δt is modified so that $\Delta t = \Delta t_{old} + \Delta t_a$ where $\Delta t_{old}$ is the previous value of Δt from the outcome of the prior steps 604-616, e.g., $\Delta t_a$ or $\Delta t_b$. Following step 624 or a NO outcome from query 622, method 600 proceeds to step 626 wherein Eqn. 4A is evaluated to provide $V_{diff}$ using as inputs, the values of $(V_{diff})_{start}$ and Δt obtained above. In subsequent step 628, the quantity n*Δt is tested to determine whether it is equal to $t_{off}$ plus or minus a small error value ξ, that is, does $n*\Delta t = t_{off} \pm \xi$?. Values of ξ are usefully in the range of 0 to 300 seconds, conveniently in the range of about 0 to 10 seconds and preferably about 0.1 seconds. If the outcome of query 628 is NO, then in step 630 the index n is incremented, that is, n is set equal to $n_{old}+1$ where $n_{old}$ is the previous value of n prior to step 630. Following step 630, method 600 loops back to step 618 where $U_{cap}$ is recalculated and subsequent steps 620-626 performed using as the value of $(V_{diff})_{start}$ the value of $V_{diff}$ obtained in step 626 of the previous iteration. This loop is repeated until the outcome of query 628 is YES.

If the outcome of query 628 is YES then in step 632 the value of $V_{diff}$ obtained in step 626 of the last iteration is stored, for example in memory within ECC 114 (see FIG. 1). In subsequent step 634 the quantity $V_{error} = (V_{diff}) - |V_{off} - V_{on}|$ is calculated. In subsequent $[V_{error} \leq \epsilon?]$ query 636 it is determined whether $V_{error}$ is less than error tolerance value ε. Values of ε are usefully in the range of 0 to 0.1 volts, conveniently in the range of about 0 to 0.01 volts and preferably about 0.005 volts. If the outcome of query 636 is NO, then, a shown by path 637, method 600 proceeds to step 638 where the $(V_{diff})_{start}$ to be used in step 618 is set equal to $(V_{diff})_{previous} + V_{error}$, where $V_{previous}$ is the value of $V_{diff}$ determined in step 626 of the last iteration. The new value of $(V_{diff})_{start}$ is then used in steps 618-636 of another iteration and the sequence repeated until the outcome of query 636 is YES, that is, until $V_{error}$ is less than or equal to ε. When the outcome of query 636 is YES, method 600 executes step 640 wherein the value of $V_{diff}$ determined in the last iteration of step 626 is used for $(V_{diff})_{init}$ in step 504 of FIG. 5, and method 600 proceeds to end 642.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for determining an initial diffusion voltage $(V_{diff})_{initial}$ as a starting point when calculating a diffusion voltage $V_{diff}$ in an electrochemical cell, comprising:

obtaining a time difference $t_{off}$ between a time when the cell was last turned-OFF and a time when the cell was next turned-ON;

selecting a starting diffusion voltage $(V_{diff})$stat based on $t_{off}$;

determining a trial diffusion voltage $V_{diff}$ based on a diffusion circuit model and $(V_{diff})_{start}$;

calculating an error voltage $V_{error}=(V_{diff})-|V_{OFF}-V_{ON}|$ where $V_{OFF}$ and $V_{ON}$ are cell voltages at cell turn-OFF and cell turn-ON respectively;

repeating the foregoing determining and calculating steps using for each iteration $(V_{diff})_{start}=(V_{diff})_{previous}+V_{error}$ until $V_{error}$ is less than or equal to a first predetermined tolerance amount $\epsilon$;

storing in a memory a value of $V_{diff}$ corresponding to the condition $V_{error}\leq\epsilon$; and setting $(V_{diff})_{initial}$ equal to the just stored value of $V_{diff}$.

2. The method of claim 1, wherein the selecting step comprises:

if $t_{off}\leq t1$, where t1 is a first predetermined constant, setting $\Delta t$ used in determining $V_{diff}$ equal to $(t_{off})/b$, where b is first predetermined amount, and setting $(V_{diff})_{start}=|V_{OFF}-V_{ON}|$.

3. The method of claim 2, wherein the selecting step further comprises:

if $t_{off}$ is not $\leq t1$, determining whether $t_{off}\geq t2$ where t2 is a second predetermined constant greater than t1;

if $t_{off}$ is not $\geq t2$, setting $\Delta t=\Delta t_a$ where $\Delta t_a$ is second predetermined amount smaller than t1 and setting $(V_{diff})_{start}=|V_{OFF}-V_{ON}|$; and if $t_{off}\geq t2$, setting $(V_{diff})_{start}=0$.

4. The method of claim 2, wherein b has a value between about 5 and 25.

5. The method of claim 4, wherein b has a value between about 7 and 15.

6. The method of claim 3, wherein $\Delta t_a$ has a value between about t1/20 and t1/5.

7. The method of claim 3, wherein t2 is in a range of about 20 to 60 times t1.

8. The method of claim 7, wherein t2 is in a range of about 30 to 50 times t1.

9. The method of claim 8, wherein t2 is about 35 to 37 times t1.

10. The method of claim 2, wherein t1 is in the range of about 400 to 800 seconds.

11. The method of claim 6, wherein t1 is about 600 seconds.

12. An energy management controller for a vehicle containing a battery, comprising:

a memory configured to store a battery condition parameter;

a processor coupled to the memory and configured to:

determine an initial diffusion voltage $(V_{diff})_{initial}$ of the battery by:

obtaining a time difference $t_{off}$ between a time when the battery was last turned-OFF and a time when the battery was next turned-ON;

selecting a starting diffusion voltage $(V_{diff})_{start}$ based on $t_{off}$;

determining a trial diffusion voltage $V_{diff}$ based on a diffusion circuit model of the battery and $(V_{diff})_{start}$;

calculating an error voltage $V_{error}=(V_{diff})-|V_{OFF}-V_{ON}|$ where $V_{OFF}$ and $V_{ON}$ are battery voltages at battery turn-OFF and battery turn-ON respectively;

repeating the foregoing determining and calculating steps using for each iteration $(V_{diff})_{start}=(V_{diff})_{previous}+V_{error}$ until $V_{error}$ is less than or equal to a first predetermined tolerance amount $\epsilon$;

storing in the memory a value of $V_{diff}$ corresponding to the condition $V_{error}\leq\epsilon$; and then setting $(V_{diff})_{initial}$ equal to the just stored value of $V_{diff}$; and then obtain a further diffusion voltage $V_{diff}$ based on the diffusion circuit model of the battery and the initial diffusion voltage $(V_{diff})_{initial}$ obtained in the setting step; and determine the battery condition parameter using the just obtained further diffusion voltage $V_{diff}$.

13. The controller of claim 12, wherein the processor is further adapted to select $(V_{diff})_{start}$ by operations comprising:

if $t_{off}\leq t1$, where t1 is a first predetermined constant, setting $\Delta t$ used in determining $V_{diff}$ equal to $(t_{off})/b$, where b is first predetermined amount, and setting $(V_{diff})_{start}=|V_{OFF}-V_{ON}|$.

14. The controller of claim 13, wherein the processor is still further adapted to select $(V_{diff})_{start}$ by operations comprising:

if $t_{off}$ is not $\leq t1$, determining whether $t_{off}\geq t2$ where t2 is a second predetermined constant greater than t1;

if $t_{off}$ is not $\geq t2$, setting $\Delta t=\Delta t_a$ where $\Delta t_a$ is second predetermined amount smaller than t1 and setting $(V_{diff})_{start}=|V_{OFF}-V_{ON}|$; and if $t_{off}\geq t2$, setting $(V_{diff})_{start}=0$.

15. The controller of claim 13, wherein b has a value between about 7 and 15.

16. The controller of claim 12, wherein the processor is further configured to relate the just obtained further diffusion voltage $V_{diff}$ to an overall voltage of the battery.

17. The controller of claim 12, wherein the processor is further configured to estimate a state of charge of the battery based on the just obtained further diffusion voltage $V_{diff}$.

18. A hybrid electric vehicle (HEV), comprising:

an internal combustion engine;

an electric motor generator coupled to the internal combustion engine, the electric motor generator configured for use as a generator to produce a charging voltage;

a battery coupled to the electric motor generator; and an engine control computer coupled to the internal combustion engine, the electric motor generator and the battery, the engine control computer comprising:

a memory for storing a plurality of parameters regarding battery conditions; and a processor coupled to the memory and configured to:

determine an initial diffusion voltage $(V_{diff})_{initial}$ by:

obtaining a time difference $t_{off}$ between a time when the battery was last turned-OFF and a time when the battery was next turned-ON;

selecting a starting diffusion voltage $(V_{diff})_{start}$ based on $t_{off}$;

determining a trial diffusion voltage $V_{diff}$ based on a diffusion circuit model of the battery and $(V_{diff})_{start}$;

calculating an error voltage $V_{error}=(V_{diff})-|V_{OFF}-V_{ON}|$ where $V_{OFF}$ and $V_{ON}$ are battery voltages at battery turn-OFF and battery turn-ON respectively;

repeating the foregoing determining and calculating steps using for each iteration $(V_{diff})_{start}=(V_{diff})_{previous}+V_{error}$ until $V_{error}$ is less than or equal to a first predetermined tolerance amount $\epsilon$;

storing in the memory a value of $V_{diff}$ corresponding to the condition $V_{error}\leq\epsilon$; and then setting $(V_{diff})_{initial}$ equal to the just stored value of $V_{diff}$; and then obtain a further value of diffusion voltage $V_{diff}$ based on the diffusion circuit model of the battery and $(V_{diff})_{initial}$ obtained in the setting step; and determine a state of charge of the battery using the just obtained further value of diffusion voltage $V_{diff}$.

19. The HEV according to claim 18, wherein the step of selecting the starting diffusion voltage $(V_{diff})_{start}$ comprises:

if $t_{off} \leq t1$, where t1 is a first predetermined constant, setting $\Delta t$ used in determining $V_{diff}$ equal to $(t_{off})/b$ where b is first predetermined amount and setting $(V_{diff})_{start} = |V_{OFF} - V_{ON}|$;

if $t_{off}$ is not $\leq t1$, determining whether $t_{off} \geq t2$ where t2 is a second predetermined constant greater than t1;

if $t_{off}$ is not $\geq t2$, setting $\Delta t = \Delta t_a$ where $\Delta t_a$ is second predetermined amount smaller than t1 and setting $(V_{diff})_{start} = |V_{OFF} - V_{ON}|$; and if $t_{off} \geq t2$, setting $(V_{diff})_{start} = 0$.

20. The HEV according to claim 19, wherein t1 is in the range of about 400 to 800 seconds.

* * * * *